(12) United States Patent
Urata et al.

(10) Patent No.: US 8,866,153 B2
(45) Date of Patent: Oct. 21, 2014

(54) FUNCTIONAL ELEMENT AND MANUFACTURING METHOD OF SAME

(75) Inventors: Akihiro Urata, Osaka (JP); Masahiro Araki, Osaka (JP); Takaaki Utsumi, Osaka (JP); Masahiro Shiota, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 43 days.

(21) Appl. No.: 13/522,883

(22) PCT Filed: Jan. 18, 2011

(86) PCT No.: PCT/JP2011/050745
§ 371 (c)(1),
(2), (4) Date: Jul. 18, 2012

(87) PCT Pub. No.: WO2011/090024
PCT Pub. Date: Jul. 28, 2011

(65) Prior Publication Data
US 2012/0292642 A1    Nov. 22, 2012

(30) Foreign Application Priority Data

Jan. 19, 2010 (JP) ................................. 2010-009352

(51) Int. Cl.
| | | |
|---|---|---|
| *H01L 29/15* | (2006.01) | |
| *H01L 31/0312* | (2006.01) | |
| *H01L 21/00* | (2006.01) | |
| *H01L 29/04* | (2006.01) | |
| *H01L 33/00* | (2010.01) | |
| *H01L 29/778* | (2006.01) | |
| *H01L 29/20* | (2006.01) | |

(52) U.S. Cl.
CPC .......... *H01L 29/7786* (2013.01); *H01L 29/045* (2013.01); *H01L 33/0095* (2013.01); *H01L 29/2003* (2013.01)
USPC ................................. 257/77; 438/33; 438/42

(58) Field of Classification Search
USPC ......................................... 257/77; 438/33, 42
See application file for complete search history.

(56) References Cited

U.S. PATENT DOCUMENTS

2001/0030328 A1* 10/2001 Ishida ........................... 257/103
2005/0224783 A1* 10/2005 Matsuyama et al. ............ 257/14

(Continued)

FOREIGN PATENT DOCUMENTS

| CN | 101055933 | 10/2007 |
|----|-----------|---------|
| JP | 2004-260083 | 9/2004 |
| JP | 2005-191551 | 7/2005 |
| JP | 2005-332892 | 12/2005 |
| JP | 2006-245043 | 9/2006 |

(Continued)

OTHER PUBLICATIONS

International Search Report dated Mar. 8, 2011, directed to International Application No. PCT/JP2011/050745; 6 pages.

*Primary Examiner* — Karen Kusumakar
(74) *Attorney, Agent, or Firm* — Morrison & Foerster LLP (57) ABSTRACT

Provided is a functional element which is obtained by forming a lamination film on a substrate and then dividing the substrate and the lamination film into a desired shape. The functional element has a hexagonal substrate, a lamination film formed on a C surface of the substrate, and a plurality of divided surfaces which are exposed by dividing the substrate into quadrilaterals. At least one line of division lines in the case of dividing the substrate into quadrilaterals is perpendicular to any one of equivalent directions of [1-100], [−1010], and [01-01] of the substrate from a [0001] direction of the substrate, and the divided surfaces formed by the division lines are inclined in a direction of other divided surfaces to which at least a part thereof is opposed.

23 Claims, 9 Drawing Sheets

(56) References Cited

U.S. PATENT DOCUMENTS

| | | |
|---|---|---|
| 2007/0111390 A1 | 5/2007 | Komura et al. |
| 2007/0298529 A1 | 12/2007 | Maeda et al. |
| 2008/0042244 A1 | 2/2008 | Anzue et al. |
| 2009/0009728 A1 | 1/2009 | Liu et al. |
| 2009/0101936 A1* | 4/2009 | Kamei et al. ........... 257/103 |
| 2010/0187542 A1* | 7/2010 | Ichihara et al. ........... 257/76 |
| 2010/0226401 A1* | 9/2010 | Hasegawa et al. ....... 372/45.01 |

FOREIGN PATENT DOCUMENTS

| | | | |
|---|---|---|---|
| JP | 2007-165855 | | 6/2007 |
| JP | 2008-98465 | | 4/2008 |
| JP | 2009-124077 | | 6/2009 |
| WO | WO-2005/055300 | | 6/2005 |
| WO | WO-2006/041134 | | 4/2006 |
| WO | WO2009/020033 | * | 2/2009 |
| WO | WO-2009/020033 | | 2/2009 |

\* cited by examiner

FUNCTIONAL ELEMENT AND MANUFACTURING METHOD OF SAME

REFERENCE TO RELATED APPLICATIONS

This application is a national stage application under 35 USC 371 of International Application No. PCT/JP2011/050745, filed Jan. 18, 2011, which claims priority from Japanese Patent Application No. 2010-009352, filed Jan. 19, 2010, the entire contents of which are incorporated herein by reference.

FIELD OF THE INVENTION

The present invention relates to functional elements using a substrate having a hexagonal crystal structure, and to methods of fabricating them. More particularly, the present invention relates to light emitting elements and field-effect transistors that are obtained by splitting an epitaxial wafer having semiconductor layers stacked on top of a substrate having a hexagonal crystal structure, and to methods of fabricating them.

BACKGROUND OF THE INVENTION

There are generally known so-called functional elements that are formed by stacking compound semiconductor layers on top of a substrate having a hexagonal crystal structure such as a sapphire substrate and that function as various devices such as LEDs (light emitting diodes) and HEMTs (heterojunction filed-effect transistors).

For example, there are conventionally known semiconductor light emitting elements that exploit light emission resulting from recombination of electrons contained in an n-type compound semiconductor layer with holes contained in a p-type compound semiconductor layer on application of a voltage to a semiconductor element having the n-type and p-type semiconductor layers bonded together with an active layer in between.

As such semiconductor light emitting elements, for example, blue light emitting diode elements are commercially available, and since these blue light emitting diode elements uses a direct transition semiconductor that allows efficient recombination of electrons with holes, they offer extremely high light emission efficiency. Thus, they are used for display on home-use electrical appliances, for indication on traffic lights, for illumination, etc.

For example, white light emitting diodes used for display and illumination as described above are fabricated by combining together a blue light emitting diode element and a phosphor (a fluorescent or phosphorescent substance), such as YAG (yttrium aluminum garnet), having a fluorescence wavelength in a region of yellow light.

Here, blue light emitting diodes use a functional element having a stacked structure of nitride semiconductor layers formed in it. Functional elements having a stacked structure of nitride semiconductor layers formed in them which are in common use as blue light emitting diode elements have a structure in which an n-type GaN layer, an active layer, and a p-type GaN layer are stacked in this order on top of a sapphire substrate. Since the sapphire substrate is electrically non-conducting, etching is performed through the p-type GaN at least into the n-type GaN layer, and an n-type side electrode that makes ohmic contact with the n-type GaN layer is provided on an exposed surface of the n-type GaN layer.

When elements formed by use of a substrate having a hexagonal crystal structure such as a sapphire substrate are split into individual chip structures, since vertical splitting at the center of splitting grooves is difficult, the splitting grooves are often given ample margins.

For example, Patent Document 1 listed below discusses a method of fabricating a semiconductor chip whereby a gallium nitride compound semiconductor chip is fabricated from a wafer (substrate) having gallium nitride compound semiconductors stacked on the principal face of a substrate, and discloses a method etc. of, in expectation of splitting grooves going to be formed obliquely, splitting a wafer at displaced processed positions on the top and bottom thereof.

Patent Document 2 listed below discusses the splitting of a GaAs wafer having a cubic crystal structure by scribing and stealth dicing, and discloses a method of, by controlling the inclination of splitting faces, splitting the wafer into a desired split shape, along with a light emitting element array chip having a characteristic shape.

Patent Document 3 listed below discloses a method of splitting a sapphire substrate believed to be a substrate having a hexagonal crystal structure.

Patent Documents 4 and 5 disclose methods of irradiating a sapphire substrate with pulse laser light to split it.

In the present invention, the term "hexagonal crystal structure" is defined to include a trigonal corundum crystal structure as well.

Many documents mention sapphire as having a trigonal corundum crystal structure, a hexagonal crystal structure, or the like. Non-patent Document 1 listed below contains a passage that reads "although [in the figure the crystal structure is] depicted like a hexagonal crystal structure, this crystal can also be depicted with a rhombohedral crystal structure; the crystal structure is thus described by the latter, which exhibits better symmetry" (a rhombohedral crystal structure refers to a trigonal crystal structure).

Intended in the present invention is a crystal substrate containing corundum (sapphire containing no impurity) or an $\alpha\text{-}Al_2O_3$ crystal system that is supposed to have the following basic properties: having a crystal axis called c-axis, and further having crystal axes called a1-, a2-, and a3-axes which cross one another at an angle of 120 degrees on a plane perpendicular to c-axis; and describable as a hexagonal crystal structure. Sapphire can be represented by such a crystal axis system, and is mentioned has having a "hexagonal crystal structure" in Patent Document 1 mentioned above. Accordingly, in the present invention, the term "crystal having a hexagonal crystal structure" is defined to include sapphire.

On the other hand, GaN and SiC, which will be mentioned later, generally have a hexagonal crystal structure (they may produce a crystal having a cubic crystal structure through a special fabrication method). These are therefore included in what is referred to as having a hexagonal crystal structure in the present invention.

In the following description, with respect to such crystals, the c-axis direction is identified by [0001], the a1-axis direction is identified by [2-1-10], the a2-axis direction is identified by [-12-10], and the a3-axis direction is identified by [-1-120]. In notations like "−1," the minus sign preceding a number substitutes for the bar placed over the number in the diagrams.

Patent Document 1: JP-A-2005-191551
Patent Document 2: JP-A-2004-260083
Patent Document 3: JP-A-2005-332892
Patent Document 4: JP-A-2006-245043
Patent Document 5: JP-A-2008-098465
Non-patent Document 1: The article "corundum" in Japanese at Wikipedia, http://ja.wikipedia.org/wiki/, as of Jan. 19, 2010

SUMMARY OF THE INVENTION

In conventional functional elements, the adoption of a method of splitting a chip at displaced processing positions makes it difficult to control the direction in which a sapphire substrate splits. As a result, many functional elements formed by being split into a chip shape turn out to be defective in the appearance inspection process after the splitting, resulting in poor yields.

The present invention aims to provide functional elements using a substrate having a hexagonal crystal structure, and methods of fabricating them with good control.

A functional element according to the invention is a functional element formed by stacking semiconductor layers on the top face of a substrate having a hexagonal crystal structure. The functional element has a boundary that forms at least two opposite sides of the top-face shape thereof. An easy-to-split portion is formed at a position $Y_d$ μm away from the top face of the substrate (where $Y_d=X_s\cdot\tan(\theta)$ and $\theta\neq0$) and displaced $X_s$ μm from the boundary. The functional element has a splitting face that includes the easy-to-split portion and of which at least part is inclined. Element separation portions along the two opposite sides, respectively, of the top face of the functional element have approximately equal widths.

A functional element according to the invention is a functional element of which the top-face has a quadrilateral shape and that is obtained by splitting a substrate having a hexagonal crystal structure and having as the nitride compound semiconductor layer stacking face a c-plane pointing in a [0001] direction. At least one of the substrate side faces exposed as a result of the substrate being split is a (1-100) plane, a (01-10) plane, or a (-1010) plane. That substrate side face is formed with an inclination in a [-1100] direction, a [0-110] direction, or a [10-10] direction, respectively, as seen from the c-plane side of the [0001] direction.

In the functional element according to the invention, the two opposite sides extending in a [11-20] direction are the shorter sides of the rectangular shape.

In the functional element according to the invention, the substrate is a substrate of one selected from the group consisting of sapphire, gallium nitride, and silicon carbide.

In the functional element according to the invention, the top face of the substrate is a face inclined by 0.2 degrees or more but 5 degrees or less with respect to a c-axis.

In the functional element according to the invention, the functional element further has an element splitting portion, and the easy-to-split portion is located within or under the element splitting portion.

A method of fabricating a functional element according to the invention is a method of splitting a plurality of functional elements formed on a substrate having a hexagonal crystal structure into individual functional elements, and includes: a step of forming an easy-to-split portion at a position $Y_d$ μm (where $Y_d=X_s\cdot\tan(\theta)$ and $\theta\neq0$) below the top face of the substrate and displaced $X_s$ μm from a boundary forming at least one side of the top-face shape of the functional element; and a step of splitting the plurality of functional elements at a splitting face that includes the easy-to-split portion and of which at least part is inclined.

A method of fabricating a functional element according to the invention is a method of splitting a plurality of functional elements formed on a substrate having a hexagonal crystal structure and having a c-plane as the top face into individual functional elements of which the top face has a quadrilateral shape, one of the sides of the quadrilateral shape being a side extending in a [11-20] or equivalent direction, and includes: a step of forming a plurality of easy-to-split portions at a position $Y_d$ (where $Y_d=X_s\cdot\tan(\theta)$ and $\theta\neq0$) below the top face of the substrate and displaced $X_s$ jam in a [1-100] or equivalent direction from the boundary forming the side extending in the [11-20] or equivalent direction of the plurality of functional elements; and a step of splitting the plurality of functional elements at a splitting face that includes the easy-to-split portion and of which at least part is inclined, and θ equals 5 degrees or more but 10 degrees or less.

In the method of fabricating a functional element according to the invention, the easy-to-split portions are located within or right under the element splitting portions.

In the method of fabricating a functional element according to the invention, the easy-to-split portions are formed by laser processing.

In the method of fabricating a functional element according to the invention, the easy-to-split portions are formed in two tiers in the up-down direction of the substrate.

In the method of fabricating a functional element according to the invention, the easy-to-split portions are formed by mechanically processing the bottom face of the substrate.

In the method of fabricating a functional element according to the invention, the substrate is split by applying a force thereto such that the bottom face of the substrate becomes convex.

According to the present invention, in functional elements that are formed on top of a substrate having a hexagonal crystal structure, and in their fabrication, the precision of element splitting is improved, and thus the yields are improved; in addition, narrowing the boundary regions helps obtain an increased number of chips per wafer.

DETAILED DESCRIPTION OF THE INVENTION

Figure 1:
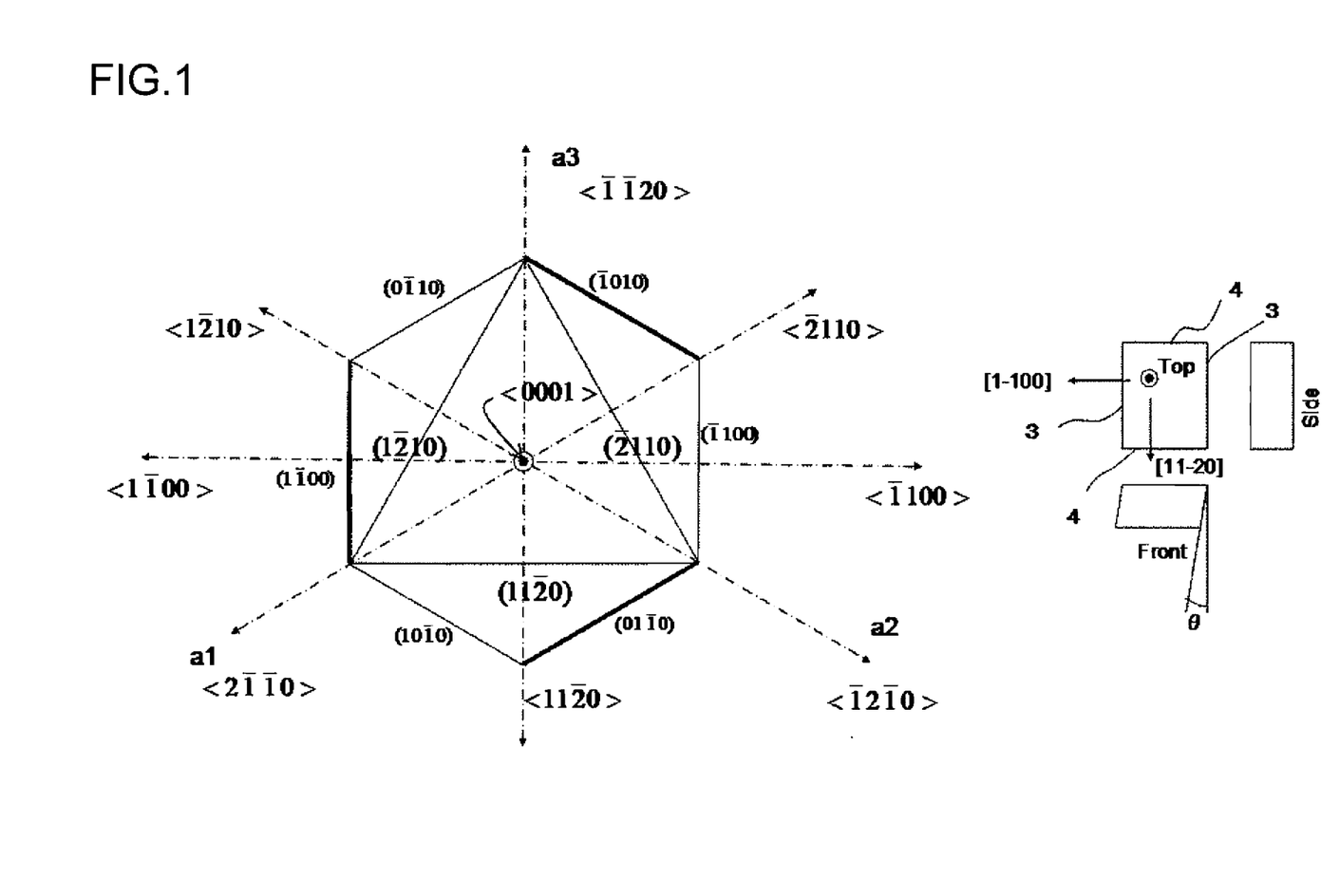
FIG. 1 is a diagram showing definitions for identifying different axis directions in a hexagonal crystal structure according to the invention.

The inventors of the present invention have found the following: in a case where a substrate having a hexagonal crystal structure and having as the nitride compound semiconductor layer stacking face a c-plane pointing in a [0001] direction is split into elements of which the top face has a quadrilateral shape, when the crystal axes are defined such that an a1-axis extends in a [2-1-10] direction, an a2-axis extends in a [-12-10] direction, and an a3-axis extends in a [-1-120] direction and that a c-axis extends in the [0001] direction, that is, the direction perpendicularly frontward from the plane of FIG. 1, if the substrate side face that is exposed by splitting is a (1-100) plane, a (01-10) plane, or a (-1010) plane, the substrate tends to split obliquely, with a fixed angle θ from the [0001] direction in a [-1100] direction, a [0-110] direction, or a [10-10] direction respectively (the [0-110] direction and the [10-10] direction are not illustrated). The inventors have also found that, with a sapphire substrate, the angle θ of oblique splitting is about 5 to 10 degrees, and preferably 6 to 8 degrees. With chips of which the top face has a rectangular shape, with respect to the side 3 extending in the [-1-120] direction (and in the opposite direction), oblique splitting occurs at an angle of θ such that the farther down the substrate (assuming that the top face of the substrate having a stacked structure points upward and its bottom face points downward), the farther displaced in the [1-100] direction. On the other hand, with respect to the side 4 extending in the [1-100] direction (and in the opposite direction), no oblique splitting occurs.

Based on these findings, in connection with the fabrication of a semiconductor element using a substrate having a hexagonal crystal structure, a functional element that is obtained by splitting a substrate with high precision (with high yields) by exploiting the above-described phenomenon of oblique splitting and a method of fabricating it will be described below.

Examples of substrates having a hexagonal crystal structure as described above include sapphire substrates (which are also mentioned as having a trigonal crystal structure as discussed earlier), GaN substrates, SiC substrates, etc.

Substrates whose top face is a "c-plane" include off-substrates whose top face is inclined from a c-plane by 5 degrees or less in, for example, a [1-100] or [-1100] direction. With an off-substrate inclined in a [1-100] or [-1100] direction, splitting needs be done with consideration given to the fact that the angle of oblique splitting changes as much as the off angle.

In the examples described in detail below, the technical features of the present invention are discussed mainly on the assumption that a (1-100) plane formed perpendicularly to the [1-100] direction is the substrate side face that is exposed by splitting. Needless to say, as mentioned previously, in this relationship, a (01-10) plane formed perpendicularly to the [01-10] direction or a (-1010) plane formed perpendicularly to the [-1010] direction may be used instead. The side face obtained by oblique splitting is a face deviated from a (1-100) plane or the like, but even then it is referred to as a "(1-100) plane as a side face."

In this example, an example of a nitride semiconductor light emitting diode element formed on top of a sapphire substrate will be discussed.

(Element Structure)

Figure 2A:
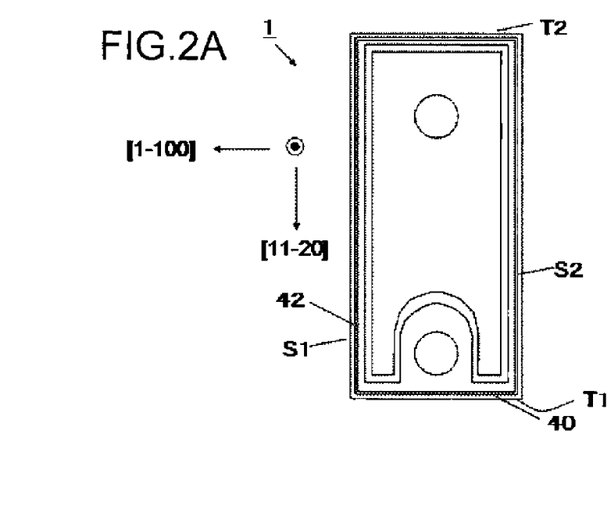
FIG. 2(a) is a top view of a functional element of Example 1 of the invention, FIGS. 2(b) and 2(b') are front views thereof.
Figure 2B:
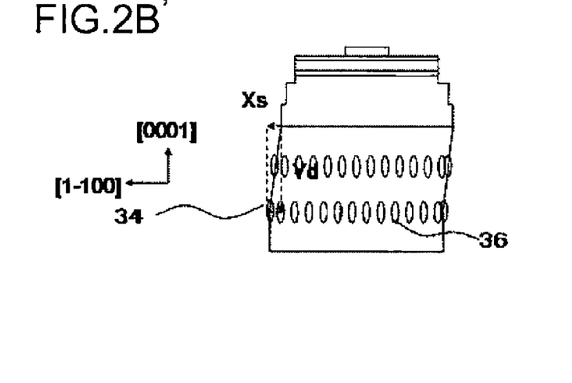
Figure 2C:
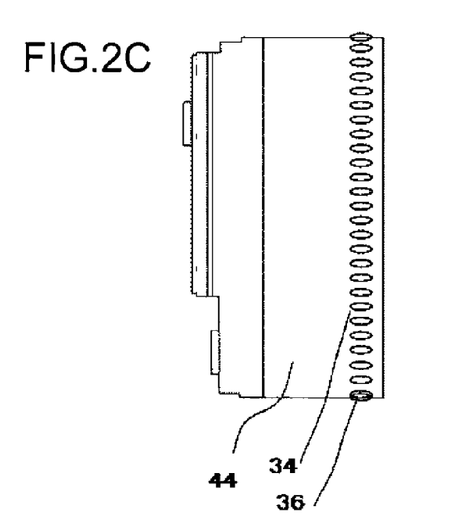
FIG. 2(c) is a side view thereof.

FIG. 2(a) is a schematic top view of a nitride semiconductor light emitting diode element of Example 1, FIG. 2(b) is a front view thereof, and FIG. 2(c) is a side view thereof.

The nitride semiconductor light emitting diode element 1 has two sides S1 and S2 parallel to a [-1-120] direction which is an a3-axis and two sides T1 and T2 parallel to a [1-100] direction. Along these sides S1, S2, T1, and T2, splitting is done with a plurality of property-altered portions 34 and 36, respectively, serving as guides for splitting (easy-to-split portions). The two split faces 44a and 44b constituting the sides S1 ad S2 are inclined from the property-altered portions 34 by 5 degrees or more but 10 degrees or less in the [-1100] direction which is opposite to the [1-100] direction with respect to the [0001] direction.

On the other hand, the split faces 46 constituting the sides T1 and T2 and shown in the front view are inclined only within a range of mere variations in the direction approximately parallel to the [0001] direction. In FIG. 2(b), the property-altered portions 34 on the split face 44a are formed with a distance, that is, an offset $X_s$, left in the [1-100] direction with respect to the center of element splitting groove regions on the substrate. As a result of splitting with the center of element splitting grooves serving as the boundary between elements, element splitting portions 31 above the splitting faces 44a and 44b are formed with approximately equal widths along the two sides S1 and S2 parallel to the [-1-120] direction which is the a3-axis. In cases where element splitting grooves are provided, when a large number of elements are inspected, if the splitting faces 44a and 44b are located within the element splitting grooves except for some fabrication errors, the widths are considered to be approximately equal. Even in cases where no element splitting grooves are provided, by inspecting at least two or more elements and processing the results statistically, it is possible to guess whether or not the present invention is implemented.

Although, in FIGS. 2(b) and (b'), the property-altered portions 34 and 36 are illustrated as if formed close to the bottom face of the substrate, the position of the property-altered portions may be determined as desired; they may be provided close to the top face of the substrate, or may be provided in two or three tiers in the thickness direction of the substrate.

(Fabrication Method)

Figure 3:
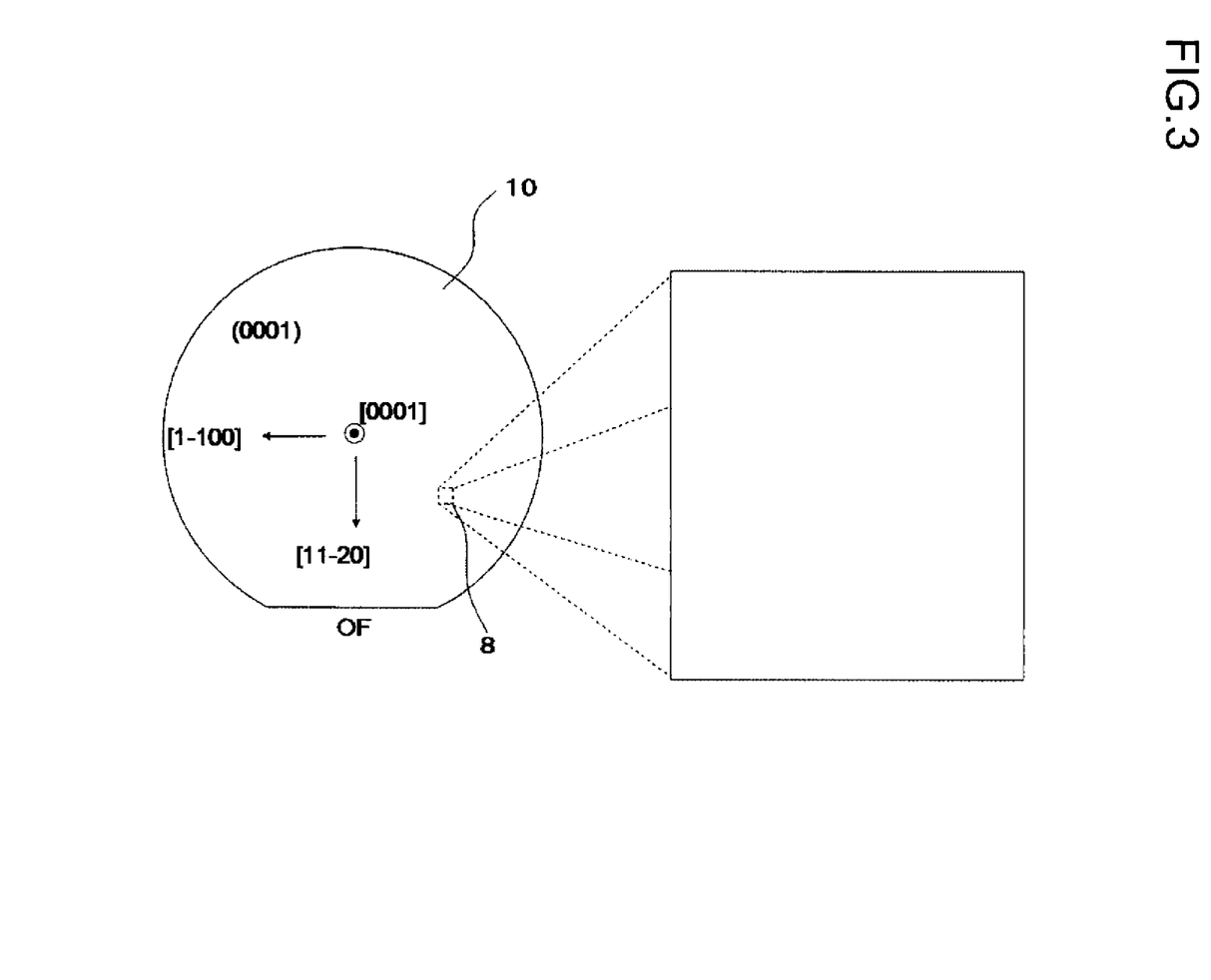
FIG. 3 is a top view of the functional element of Example 1 of the invention, in the state of a substrate before chip splitting.

A method of fabricating the functional element of Example 1 of the present invention will now be described with reference to FIG. 3. First, a sapphire substrate 10 shown in FIG. 3, which is a top view, is prepared in the following manner. The top face of the sapphire substrate 10 is a c-plane, that is, a (0001) plane, and the crystal orientation of the sapphire substrate 10 is so aligned that, with respect to the orientation flat (OF) at the front, the rearward direction is a [-1-120] direction which is an a3-axis, and the leftward direction is a [1-100] direction. With a plurality of wafers, the rearward direction remains constant owing to the OF, but the leftward and rightward directions do not; it is, however, preferable to make them constant as well. This can be achieved, for example, by making the top and bottom faces clearly distinguishable (making the bottom face slightly coarse, or by forming another orientation flat.

Figure 4:
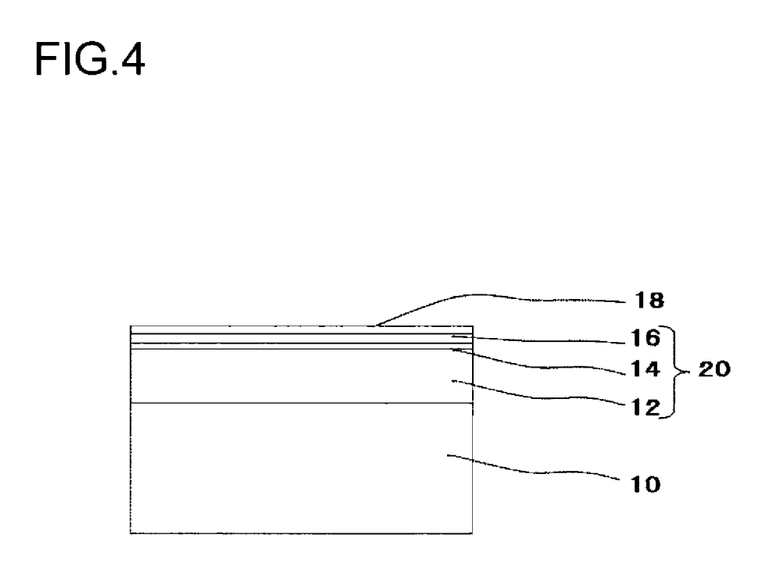
FIG. 4 is a sectional view of the functional element of Example 1 of the invention, after translucent electrode formation.

A sectional view of a part corresponding to a within-a-wafer region 8 of the sapphire substrate 10 after a crystal growth process and a translucent electrode formation process is shown in FIG. 4. As will be clear from FIG. 4, by stacking an n-type nitride semiconductor layer 12, an active layer 14, and a p-type nitride semiconductor layer 16 in this order on top of a sapphire substrate 10 of which the top face is a c-plane (which may have a shape, such as surface irregularities, formed on it), it is possible to form nitride semiconductor stacked layers 20.

Here, the n-type nitride semiconductor layer 12, the active layer 14, and the p-type nitride semiconductor layer 16 can be formed by placing the sapphire substrate 10 inside an MOCVD (metal organic chemical vapor deposition) machine and then growing, through crystal growth, a nitride semiconductor crystal of GaN, AlGaN, InGaN, or the like by an MOCVD process.

Thereafter, the wafer having the nitride semiconductor stacked layers 20 formed on the top face of the sapphire substrate 10 is subjected to heat treatment, and thereby the p-type dopant in the p-type nitride semiconductor layer 16 is activated.

Here, as the n-type nitride semiconductor layer 12, it is possible to use, for example, a single layer or a plurality of layers formed by doping a nitride semiconductor crystal of the composition $Al_{x2}In_{y2}Ga_{z2}N$ ($0 \leq x2 \leq 1$, $0 \leq y2 \leq 1$, $0 \leq z2 \leq 1$, $x2+y2+z2 \neq 0$) with an n-type dopant. In this formula, x2 represents the composition ratio of Al, y2 represents the composition ratio of In, and z2 represents the composition ratio of Ga. As the n-type dopant, it is possible to use, for example, silicon and/or germanium.

As the nitride semiconductor active layer 14, it is possible to use, for example, an undoped nitride semiconductor crystal of the formula $Al_{x3}In_{y3}Ga_{z3}N$ ($0 \leq x3 \leq 1$, $0 \leq y3 \leq 1$, $0 \leq z3 \leq 1$, $x3+y3+z3 \neq 0$) or a single layer or a plurality of layers formed by doping a nitride semiconductor crystal of that composition with at least one of a p-type dopant and an n-type dopant. In the formula, x3 represents the composition ratio of Al, y3 represents the composition ratio of In, and z3 represents the composition ratio of Ga. The nitride semiconductor active layer may be configured to have a single quantum well (SQW) structure or a multiple quantum well (MQW) structure.

As the p-type nitride semiconductor layer 16, it is possible to use, for example, a single layer or a plurality of layers formed by doping a nitride semiconductor crystal of the composition $Al_{x4}In_{y4}Ga_{z4}N$ ($0 \leq x4 \leq 1$, $0 \leq y4 \leq 1$, $0 \leq z4 \leq 1$, $x4+y4+z4 \neq 0$) with a p-type dopant. In this formula, x4 represents the composition ratio of Al, y4 represents the composition ratio of In, and z4 represents the composition ratio of Ga. As the p-type dopant, it is possible to use, for example, magnesium and/or zinc.

Next, on top of the p-type nitride semiconductor layer 16, a translucent (or transparent) electrode 18 made of, for example, ITO (indium tin oxide) is formed. Here, the translucent electrode 18 can be formed by sputtering, vacuum deposition, or the like.

Figure 5A:
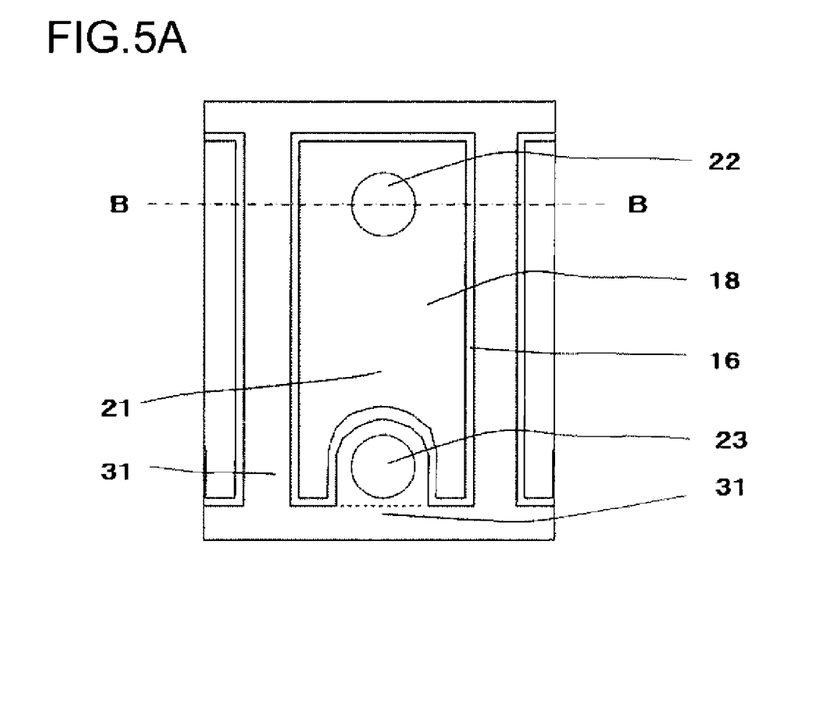
FIG. 5(a) is a top view of the functional element of Example 1 of the invention, after a p-side and n-side electrode formation process.
Figure 5B:
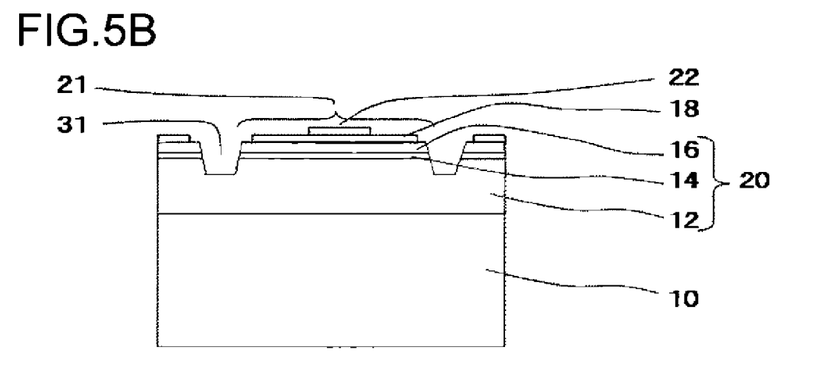
FIG. 5(b) is a front view thereof.

FIG. 5(*a*) is a top view of part of the wafer on completion of the processes described below, namely a translucent electrode 18 patterning process, an n-type nitride semiconductor layer exposure process and a p-side and n-side electrode formation process, and FIG. 5(*b*) is an element sectional view along line BB in FIG. 5(*a*).

In the translucent electrode 18 patterning process, a protection mask (not illustrated) for the translucent electrode 18 is formed to suit the chip size, and part of the translucent electrode 18 is removed by wet etching using, for example, hydrogen fluoride.

For the translucent electrode 18, it is possible to use, instead of ITO, for example, indium oxide, tin oxide, ZnO (zinc oxide), or a material containing at least one selected from the group consisting of Au, Ag, Pt, Ti, Pd, Al, and Ni.

In the n-type nitride semiconductor layer exposure process, a protection mask (not illustrated) in which an opening for contact with the n-type nitride semiconductor layer is formed so as to include the patterned translucent electrode 18 and part of its circumference, and part of the p-type nitride semiconductor layer is removed by dry etching or the like. In this way, an n-type nitride semiconductor layer exposed portion is formed. Of the n-type nitride semiconductor layer exposed portion, the part other than around an n-side electrode 23 serves as an element splitting portion 31, and the other part serves as a nitride semiconductor stacked layer functional structure region 21.

In the p-side and n-side electrode formation process, a protection mask (not illustrated) in which an opening is formed in parts corresponding to p-side and n-side electrodes is formed; then a p-side electrode 22 is formed on the top face of the translucent electrode 18, and an n-side electrode 23 is formed on the top face of the n-type nitride semiconductor layer exposed portion. Here, the p-side electrode 22 and the n-side electrode 23 can be formed by vacuum deposition, sputtering, or the like. Alternatively, it is also possible, for example, to form the p-side electrode 22 by use of a protection mask in which an opening is formed only in a part thereof corresponding to the p-side electrode, and then form the n-side electrode 23 by use of a protection mask in which an opening is formed only in a part thereof corresponding to the n-side electrode. That is, the p-side electrode 22 and the n-side electrode 23 may be formed in any order.

For the n-side electrode, it is possible to use a single layer of metal containing at least one selected from the group consisting of Au (gold), Ag (silver), Pt (platinum), Ti (titanium), Pd (palladium), Al (aluminum), and Ni (nickel), or a plurality of layers having a plurality of such single layers of metal stacked together.

For the p-side electrode, it is possible to use a single layer of metal containing at least one selected from the group consisting of Au, Ag, Pt, Ti, Pd, Al, and Ni, or a plurality of layers having a plurality of such single layers of metal stacked together.

In a protection film formation process (not illustrated), a protection layer is formed which covers the translucent electrode 18 and those parts of the p-type nitride semiconductor layer 16, the active layer 14, and the n-type nitride semiconductor layer 12 which are exposed in the n-type nitride semiconductor layer exposed portion.

As a surface protection film, it is possible to use, for example, an insulating layer containing at least one selected from the group consisting of silicon oxide, silicon nitride, and titanium oxide.

Figure 6A:
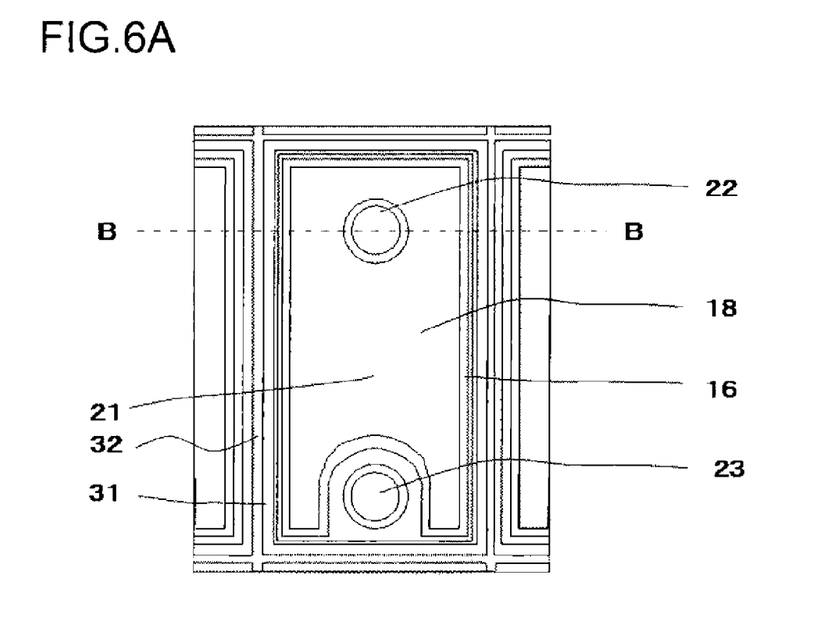
FIG. 6(a) is a top view of the functional element of Example 1 of the invention, after a splitting groove formation process.
Figure 6B:
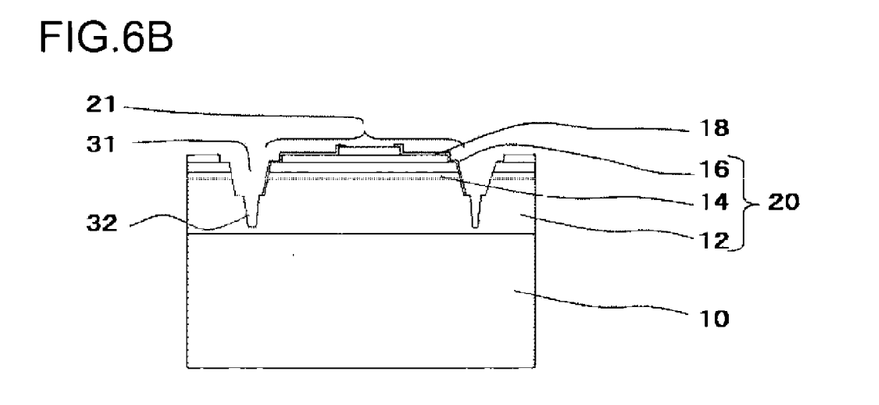
FIG. 6(b) is a front view thereof.

FIGS. 6(*a*) and 6(*b*) are a top view and a sectional view of a state after an element splitting groove formation process.

Here, element splitting grooves 32 which define the boundaries between elements can be formed by forming a protection mask in which an opening is formed around the circumference of the nitride semiconductor stacked layer functional structure region 21, and then removing the circumference of the nitride semiconductor stacked layers, for example, by etching. The element splitting grooves 32 may instead be formed by mechanical processing using a diamond needle, a dicing blade, or the like.

Figure 7A:
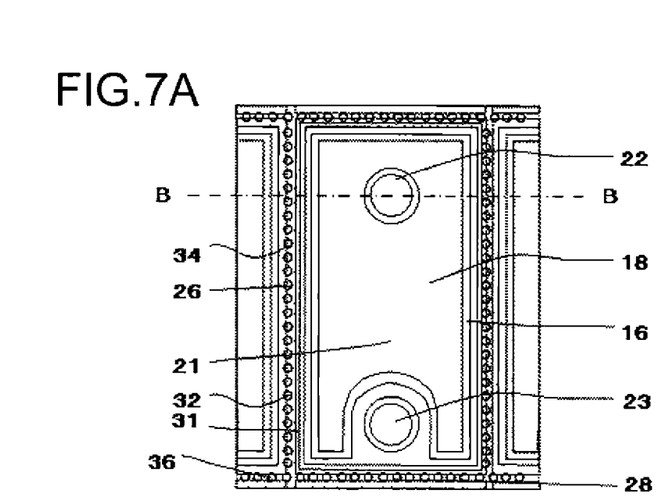
FIG. 7(a) is a top view of the functional element of Example 1 of the invention, after a process of forming easy-to-split portions which will serve as guides for chip splitting, and FIGS. 7(b), 7(b') and 7(b") are front views thereof.
Figure 7B:
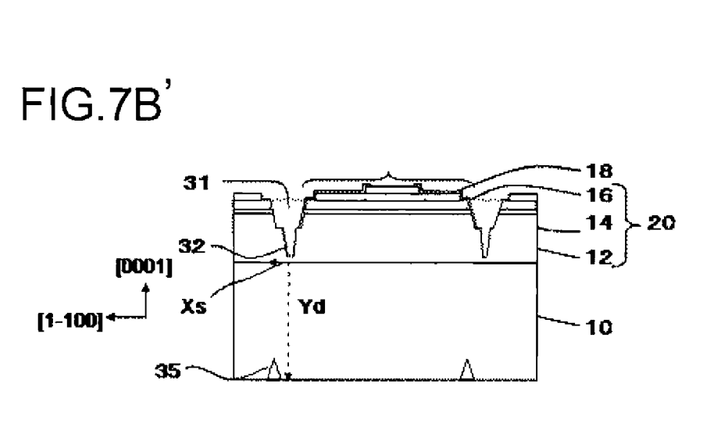

FIGS. 7(*a*) and 7(*b*) are a top view and a sectional view of a state after laser scribing.

Along the element splitting grooves 32, by laser scribing, property-altered portions 34 and 36 which will serve as guides for chip splitting (easy-to-split portions) are formed at the [11-20] direction sides 26 and the [1-100] direction sides 28. Then, along the property-altered portions 34 and 36, breaking is performed, and thus nitride semiconductor light emitting diode elements 1 are fabricated which each correspond to a split chip. As shown in FIG. 7(*b'*), it is also possible to form, by mechanical processing using a diamond needle, a dicing blade, or the like, scribing lines 35 and 37 as guides for chip splitting on the bottom face of the substrate (the scribing lines 37 are not illustrated because no side sectional view of a chip is provided).

When chips are split along the element splitting grooves 32, the property-altered portions 36 which will serve as guides for chip splitting (easy-to-split portions) at the [1-100] direction sides 28 are provided right under the center of the element splitting grooves 32. By contrast, the property-altered portions 34 which will serve as guides for chip splitting (easy-to-split portions) at the [11-20] direction sides 26 are formed with a displacement offset $X_s$ with respect to the center of the element splitting grooves 32. The amount of the offset $X_s$ is determined with consideration given to the substrate thickness and the position where the guides for chip splitting (easy-to-split portions) are formed. For example, in a case where the property-altered portions 34 which will serve as guides for chip splitting (easy-to-split portions) are formed inside the sapphire substrate at a position $Y_d$ about 24 μm below the substrate surface by laser, providing an offset $X_s$ of about 3 μm in the [1-100] direction, that is, leftward in the diagrams, makes it possible to split chips at the center of the element splitting grooves. For another example, in a case where the property-altered portions 34 which will serve as guides for chip splitting (easy-to-split portions) are formed inside the sapphire substrate at a position $Y_d$ about 48 μm below the substrate surface by laser, providing an offset $X_s$ of about 6 μm makes it possible to split chips at the center of the element splitting grooves. In generalized terms, in a method of splitting elements by providing the property-altered portions 34 under the element splitting grooves at the [11-20] direction sides 26 by laser, in a case where the property-altered portions are formed at a position Y μm deep from the wafer surface, the position is displaced $X_s$ μm (where $X_s=Y_d\cdot\tan))(7°)$) leftward from the center of the element splitting grooves. Providing the property-altered portions 34 at two levels makes chip splitting easier. The property-altered portions 34 at two levels may be formed at the same positions as seen in a top view (away from each other only in the up-down direction). It is, however, further preferable that, as shown in FIG. 7(b"), the property-altered portions 34 be formed on inclined broken lines so as to have an offset of $X_s$ at a depth of $Y_d$. Likewise, third, forth property-altered portions may further be provided, or linear or planar property-altered portions that are continuous in the up-down direction of the substrate may be provided.

Figure 8A:
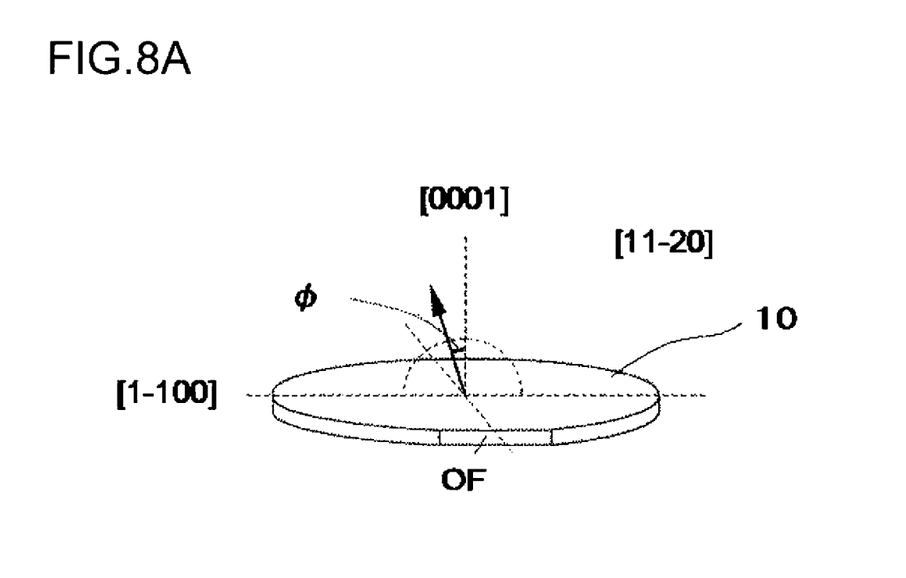
FIG. 8(a) is a perspective view of a substrate used in the functional element of Example 1 of the invention.
Figure 8B:
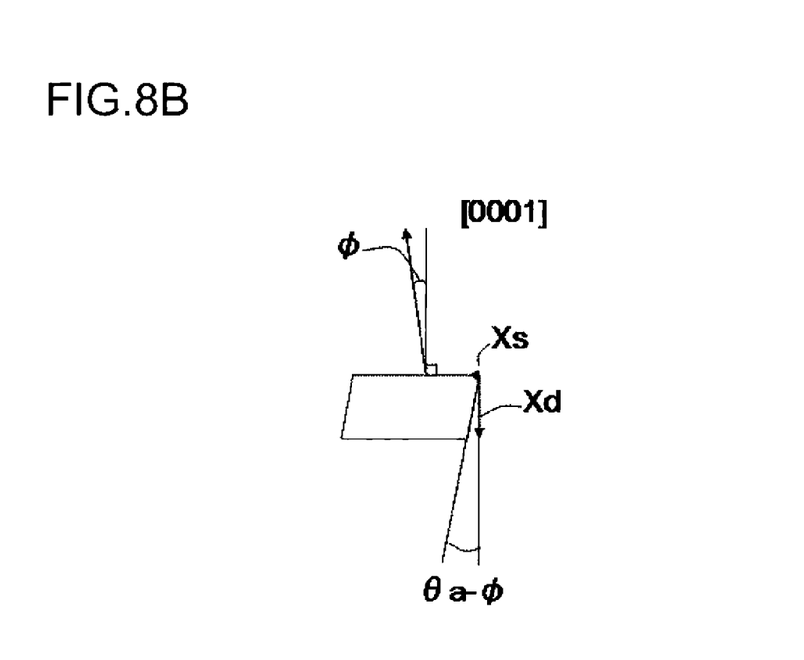
FIG. 8(b) is a front view thereof.

The reason that the property-altered portions 34 are located with an offset $X_s$ is as follows. The inventors of the present invention have found that, when splitting is performed at the sides 26, cracks tend to develop with an inclination of about 5 to 10 degrees, in particular 6 to 8 degrees, such that the farther down the sapphire substrate 10, the farther displaced in the [1-100] direction. This tendency can be exploited to split chips stably. When the inclined surfaces at the chip side faces have an inclination equal to or smaller than 5 degrees, the chip side faces have a small inclined area, and thus the efficiency of light extraction through the chip side faces is low. When the inclined surfaces at the chip side faces have an inclination equal to or larger than 5 degrees, the efficiency of light extraction through the chip side faces is improved; with an inclination equal to or larger than 10 degrees, however, guides for chip splitting (easy-to-split portions) need to be formed with an accordingly greater offset with respect to the center of the splitting grooves. When guides for chip splitting (easy-to-split portions) are formed by laser, a great offset requires laser light to be shone outside the splitting grooves, right under the element active layer, causing considerable damage to the element active layer. Damage to the element active layer causes a lowering in the light output of the nitride semiconductor light emitting diode element, and therefore it is preferable that the property-altered portions be formed right under the element splitting portions. An inclination of 10 degrees or less with a small offset is preferable. As shown in a perspective view in FIG. 8(a), with an off-substrate whose top face is inclined, for example, by φ in the [1-100] direction from a c-plane, as shown in FIG. 8(b), which is a front view of a chip using a substrate having an off-angle, the offset can be set such that $X_s=Y_d\cdot\tan(\theta a-\phi)$. Here, θa represents the direction of oblique splitting as observed when the substrate has no off-angle, and equal to, for example, 7 degrees, and preferably 5 to 10 degrees. Attention needs to be paid to the direction of the off-angle and the sign of φ, that is, whether it is positive or negative (the off-direction).

In the example under discussion, the width of the element splitting grooves is 10 μm (5 μm at one side) and the interval between the n-type nitride semiconductor layer exposed portions including the element splitting grooves 32 is about 30 μm. Thus, with an inclination of 5 to 10 degrees, the offset position of laser processing at a position of about 40 μm from the epitaxial surface does not pass right under the active layer, and accordingly the active layer is unlikely to suffer damage.

Chips having a rectangular shape are prone to be more difficult to split at the shorter sides than at the longer sides. Thus, aligning the shorter-side direction of chips with the [11-20] direction and their longer-side direction with the [1-100] direction makes the splitting easier to control and helps increase splitting yields.

Chips do not necessarily have to have a rectangular shape, but may have any shape composed of two pairs of mutually parallel opposite sides; for example, they may have the shape of a parallelogram. In that case, when the sides of each pair are made parallel with respect to the (1-100) plane, the (01-01) plane, and the (-1010) plane (in a sapphire substrate, these planes correspond to an m-plane which crosses an r-plane existing inside the crystal; an r-plane is a threefold symmetric plane existing in a c-plane sapphire substrate having a hexagonal crystal structure; for example, x-ray measurement with φ rotated through 360° under the conditions X=57.6° and 2θ=25.59° yields a signal that indicates an r-plane at three places; a sapphire substrate in which the crystal planes corresponding to the three places at which the signal appears are defined as r-planes (1-102), (01-12), and (-1012) is considered to be a model in which splitting occurs along an r-plane, allowing one to assume splitting at an r-plane and an m-plane combined together, at both of which splitting is crystallographically easy; this combination of an r-plane, at which splitting occurs at 28.8°, and an m-plane, at which splitting occurs vertically, is believed to allow splitting at an angle of 5 to 10 degrees), it is possible to perform splitting stably at all side faces of chips, and it is thereby possible to increase splitting yields further than when chips are split into a rectangular shape.

As a method of forming the property-altered portions, laser scribing is suitable whereby laser light or the like with a pulse width of femtoseconds to nanoseconds is condensed inside the substrate from above its top face or from below its bottom face to thereby perform processing. This condenses the laser light in a part of the sapphire substrate inside it with high energy and thereby alters the properties of the sapphire crystal there, making cracks more likely to develop. As to the number of tiers and the position of the just-mentioned inside processing, the processing may be performed in one or more tiers with consideration given to oblique splitting, but the greater the number of tiers, the longer it takes. With a sapphire substrate with a thickness of 130 μm, forming property-altered portions in two tiers provides a good balance between the cycle time and the splitting yield. As to the pulse width of the laser light, using laser light of picoseconds to femtoseconds, such as laser light having its peak wavelength in an infrared region, permits efficient inside processing. On the other hand, laser light of nanoseconds, such as laser light having its peak wavelength in an ultraviolet region, has the advantage of being extremely inexpensive, though slightly less efficient than laser light of picoseconds to femtoseconds.

After the easy-to-split portions are formed as described above, a pressure is applied to the substrate from above so that its bottom face becomes convex, and thereby splitting faces including the easy-to-split portions are formed; thus, the substrate is split.

Example 2 deals with a nitride semiconductor HEMT (hetero-junction filed-effect transistor) element formed on top of a SiC substrate, as an example of a field-effect transistor which is a semiconductor functional element.

Figure 9:
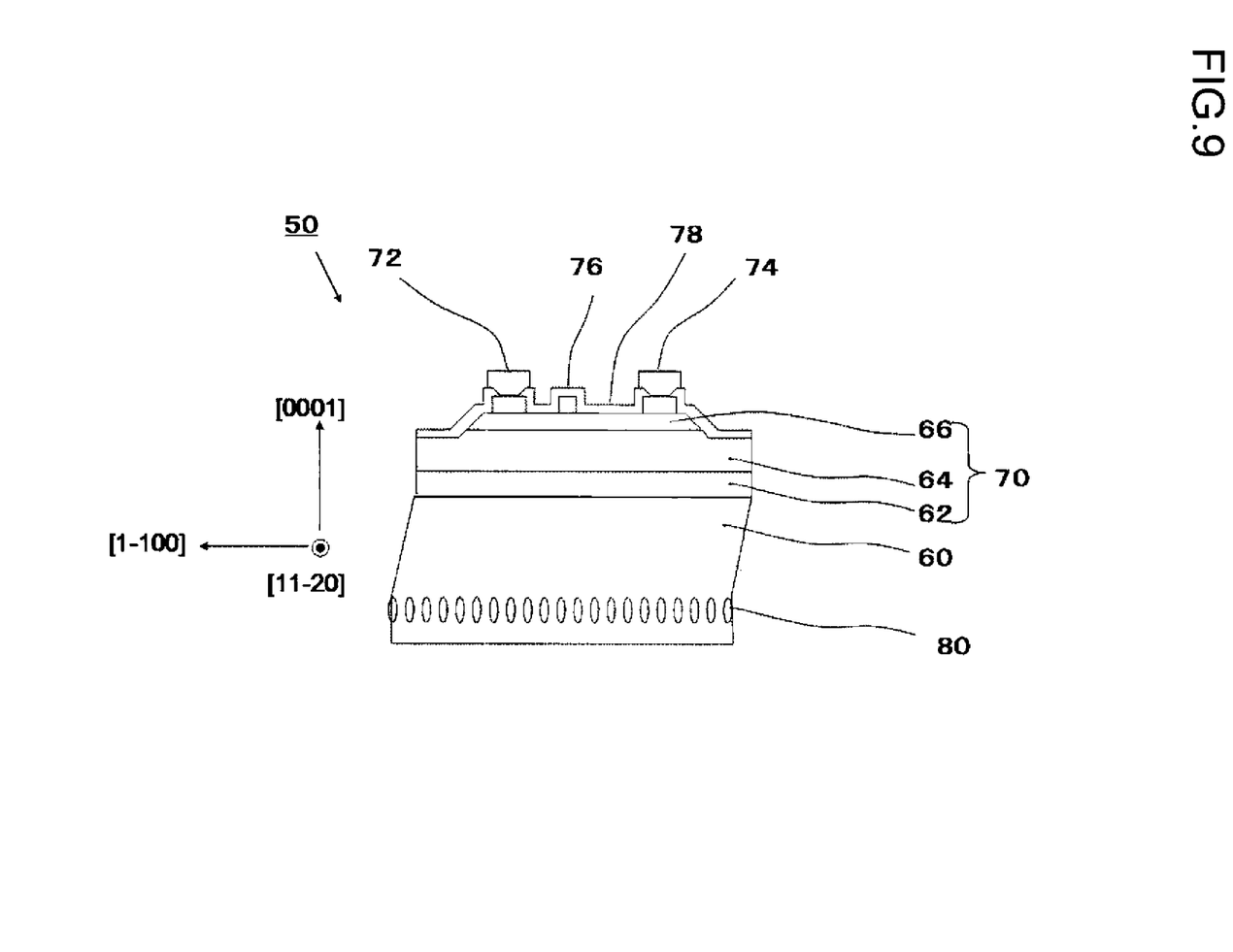
FIG. 9 is a front view of a functional element of Example 2 of the invention.

FIG. 9 is a schematic front view of a nitride semiconductor HEMT element 50, accompanied by an indication of the crystal orientation of the substrate. Here, the nitride semiconductor HEMT element 50 includes: a SiC substrate 60 having a c-plane as the top face; a nitride semiconductor stacked layer functional structure 70 having a nitride semiconductor buffer layer 62, an i-type nitride semiconductor layer 64, and an n-type nitride semiconductor layer 66 stacked in this order on top of the SiC substrate 60; a source electrode 72, a drain electrode 74, and a gate electrode 76 arranged further on top; an insulating layer 78 arranged between the electrodes; and a pad electrode arranged. It further includes property-altered portions 80 formed by laser scribing.

The nitride semiconductor HEMT element 50 has a chip shape of which the top face has a quadrilateral shape, and the processing position which will serve as guides for chip splitting (easy-to-split portions) at the [11-20] direction sides when chips are split is formed with an offset of $X_s$ in the [1-100] direction at a position $Y_d$ below the substrate with respect to the center of splitting grooves. The amount of the offset is determined with consideration given to the substrate thickness and the position where the guides for chip splitting (easy-to-split portions) are formed. For example, in a case where the property-altered portions which will serve as guides for chip splitting (easy-to-split portions) are formed inside the sapphire substrate 60 at a position about 24 μm below the SiC substrate surface by laser, providing an offset of about 3 μm makes it possible to split chips at the center of the element splitting grooves. Forming another tier of property-altered portions in the SiC substrate makes the splitting easier. For example, a second tier of property-altered portions which will serve as guides for chip splitting (easy-to-split portions) may be formed by laser at a position of about 70 μm below the SiC surface. The property-altered portions in the second tier may be given the same offset (3 μm) as those in the first tier, but it is further preferable to give them an offset (9 μm) commensurate with their depth, with consideration given to the direction of oblique splitting.

No consideration needs to be given to oblique splitting of chips in the direction parallel to the [1-100] direction, and therefore guides for chip splitting (easy-to-split portions) are formed at the center of the splitting grooves.

Chips having a rectangular shape are prone to be more difficult to split at the shorter sides than at the longer sides. Thus, aligning their shorter sides with the [11-20] direction makes the splitting easier to control and helps increase splitting yields.

As a method of forming the property-altered portions, as in Example 1, laser scribing may be adopted whereby laser light or the like with a pulse width of femtoseconds to nanoseconds is condensed inside the SiC substrate from above its top face or from below its bottom face to thereby perform processing. This condenses the laser light in a part of the SiC substrate inside it with high energy and thereby alters the properties of the SiC crystal there, making cracks more likely to develop. As to the number of tiers and the position of the just-mentioned inside processing, the processing may be performed in one or more tiers with consideration given to oblique splitting, but the greater the number of tiers, the longer the cycle time of the processing. With the SiC substrate with a thickness of 130 μm used in this Example, forming the property-altered portions in two tiers provides a good balance between the cycle time and the splitting yield. There is, however, no restriction on the thickness of the SiC substrate, and increasing and decreasing the number of tiers of property-altered portions to suit the thickness makes it possible to perform processing with a good balance between the cycle time and the splitting yield.

In particular, using laser light with a pulse width of picoseconds to femtoseconds allows efficient inside processing. Laser light with a pulse width of nanoseconds has the advantage of being extremely inexpensive, though less efficient than laser light of picoseconds to femtoseconds.

With consideration given to oblique splitting, splitting is possible with high yields also by subjecting the SiC substrate surface to V groove formation by laser scribing, scribing using a diamond stylus, or cutting with a dicing blade.

The present invention is suitably used in functional elements obtained by splitting an epitaxial wafer having semiconductor layers staked on top of a substrate, like nitride compound semiconductor light emitting elements such as LEDs and lasers and field-effect transistors such as HEMTs.

The invention claimed is:

1. A functional element formed by stacking semiconductor layers on a top face of a substrate having a hexagonal crystal structure, wherein
    the functional element has a boundary that forms at least two opposite sides of a top-face shape thereof,
    a first easy-to-split portion is formed at a position $Y_d$ μm away from the top face of the substrate (where $Y_d = X_s \cdot \tan(\theta)$ and $\theta \neq 0$) and displaced $X_s$ μm from the boundary,
    a second easy-to-split portion is formed at a different position from the first easy-to-split portion with respect to a direction perpendicular to the top face of the substrate,
    the functional element has a splitting face that includes the first and second easy-to-split portions and of which at least part is inclined, and
    element separation portions along the two opposite sides, respectively, of the top face of the functional element have approximately equal widths.

2. A functional element of which a top-face has a quadrilateral shape and that is obtained by splitting a substrate having a hexagonal crystal structure and having as a nitride compound semiconductor layer stacking face a c-plane pointing in a [0001] direction,
    at least one of substrate side faces exposed as a result of the substrate being split is a (1-100) plane, a (01-10) plane, or a (-1010) plane, and
    the substrate side face is formed with an inclination in a [-1100] direction, a [0-110] direction, or a [10-10] direction, respectively, as seen from a c-plane side of the [0001] direction.

3. The functional element according to claim 2, wherein the quadrilateral shape is a rectangular shape, and the two opposite sides extending in a [11-20] direction are shorter sides of the rectangular shape.

4. The functional element according to claim 1, wherein the substrate is a substrate of one selected from the group consisting of sapphire, gallium nitride, and silicon carbide.

5. The functional element according to claim 1, wherein the top face of the substrate is a face inclined by 0.2 degrees or more but 5 degrees or less with respect to a c-axis.

6. The functional element according to claim 1, wherein the functional element further has an element splitting portion, and the easy-to-split portion is located within or under the element splitting portion.

7. A method of fabricating a functional element, the method being a method of splitting a plurality of functional elements formed on a substrate having a hexagonal crystal structure into individual functional elements, the method comprising:
a step of forming a first easy-to-split portion at a position $Y_d$ μm (where $Y_d = X_s \cdot \tan(\theta)$ and $\theta \neq 0$) below the top face of the substrate and displaced $X_s$ μm from a boundary forming at least one side of a top-face shape of the functional element;
a step of forming a second easy-to-split portion at a different position from the first easy-to-split portion with respect to a direction perpendicular to the top face of the substrate; and
a step of splitting the plurality of functional elements at a splitting face that includes the first and second easy-to-split portions and of which at least part is inclined.

8. A method of fabricating a functional element, the method being a method of splitting a plurality of functional elements formed on a substrate having a hexagonal crystal structure and having a c-plane as a top face into individual functional elements of which a top face has a quadrilateral shape, wherein
one of sides of the quadrilateral shape is a side extending in a [11-20] or equivalent direction, and
the method comprises:
a step of forming a plurality of easy-to-split portions at a position $Y_d$ μm (where $Y_d = X_s \cdot \tan(\theta)$ and $\theta \neq 0$) below the top face of the substrate and displaced $X_s$ μm in a [1-100] or equivalent direction from a boundary forming the side extending in the [11-20] or equivalent direction of the plurality of functional elements; and
a step of splitting the plurality of functional elements at a splitting face that includes the easy-to-split portion and of which at least part is inclined, and
$\theta$ equals 5 degrees or more but 10 degrees or less.

9. The method of fabricating a functional element according to claim 7, wherein the easy-to-split portions are located within or right under the element splitting portions.

10. The method of fabricating a functional element according to claim 7, wherein the easy-to-split portions are formed by laser processing.

11. The method of fabricating a functional element according to claim 10, wherein the easy-to-split portions are formed in two tiers in an up-down direction of the substrate.

12. The method of fabricating a functional element according to claim 7, wherein the easy-to-split portions are formed by mechanically processing a bottom face of the substrate.

13. The method of fabricating a functional element according to claim 7, wherein the substrate is split by applying a force thereto such that a bottom face of the substrate becomes convex.

14. The functional element according to claim 2, wherein the substrate is a substrate of one selected from the group consisting of sapphire, gallium nitride, and silicon carbide.

15. The functional element according to claim 3, wherein the substrate is a substrate of one selected from the group consisting of sapphire, gallium nitride, and silicon carbide.

16. The functional element according to claim 2, wherein the top face of the substrate is a face inclined by 0.2 degrees or more but 5 degrees or less with respect to a c-axis.

17. The functional element according to claim 3, wherein the top face of the substrate is a face inclined by 0.2 degrees or more but 5 degrees or less with respect to a c-axis.

18. The functional element according to claim 2, wherein
the functional element has a boundary that forms at least two opposite sides of a top-face shape thereof,
an easy-to-split portion is formed at a position $Y_d$ μm away from the top face of the substrate (where $Y_d = X_s \cdot \tan(\theta)$ and $\theta \neq 0$) and displaced $X_s$ μm from the boundary,
the functional element further has an element splitting portion, and
the easy-to-split portion is located within or under the element splitting portion.

19. The functional element according to claim 3, wherein
the functional element has a boundary that forms at least two opposite sides of a top-face shape thereof,
an easy-to-split portion is formed at a position $Y_d$ μm away from the top face of the substrate (where $Y_d = X_s \cdot \tan(\theta)$ and $\theta \neq 0$) and displaced $X_s$ μm from the boundary,
the functional element further has an element splitting portion, and
the easy-to-split portion is located within or under the element splitting portion.

20. The method of fabricating a functional element according to claim 8, wherein the easy-to-split portions are located within or right under the element splitting portions.

21. The method of fabricating a functional element according to claim 8, wherein the easy-to-split portions are formed by laser processing.

22. The method of fabricating a functional element according to claim 8, wherein the easy-to-split portions are formed by mechanically processing a bottom face of the substrate.

23. The method of fabricating a functional element according to claim 8, wherein the substrate is split by applying a force thereto such that a bottom face of the substrate becomes convex.

* * * * *